(12) United States Patent
Mori et al.

(10) Patent No.: US 12,303,829 B2
(45) Date of Patent: May 20, 2025

(54) DETOXIFICATION DEVICE AND INLET NOZZLE

(71) Applicant: Edwards Japan Limited, Chiba (JP)

(72) Inventors: Nobuo Mori, Chiba (JP); Mitsunori Abe, Chiba (JP); Masahiro Tanaka, Chiba (JP)

(73) Assignee: Edwards Japan Limited, Chiba (JP)

(*) Notice: Subject to any disclaimer, the term of this patent is extended or adjusted under 35 U.S.C. 154(b) by 715 days.

(21) Appl. No.: 16/972,843

(22) PCT Filed: Jun. 3, 2019

(86) PCT No.: PCT/JP2019/021926
§ 371 (c)(1),
(2) Date: Dec. 7, 2020

(87) PCT Pub. No.: WO2019/239935
PCT Pub. Date: Dec. 19, 2019

(65) Prior Publication Data
US 2021/0245093 A1 Aug. 12, 2021

(30) Foreign Application Priority Data

Jun. 14, 2018 (JP) ................................ 2018-113898

(51) Int. Cl.
*B01D 53/38* (2006.01)
*B01D 53/76* (2006.01)
(Continued)

(52) U.S. Cl.
CPC ............ *B01D 53/38* (2013.01); *B01D 53/76* (2013.01); *C23C 16/4412* (2013.01);
(Continued)

(58) Field of Classification Search
None
See application file for complete search history.

(56) References Cited

U.S. PATENT DOCUMENTS

| | | | |
|---|---|---|---|
| 4,668,180 A | 5/1987 | Newman | |
| 5,931,654 A * | 8/1999 | Chamberland | ......... C03B 5/235 |
| | | | 239/105 |
| 2007/0217983 A1 | 9/2007 | Stanton et al. | |

FOREIGN PATENT DOCUMENTS

| | | | |
|---|---|---|---|
| JP | 08313160 A | * | 11/1996 |
| JP | H08313160 A | | 11/1996 |

(Continued)

OTHER PUBLICATIONS

Michitaka et al. JP2001355825A—translated document (Year: 2001).*
(Continued)

*Primary Examiner* — Jelitza M Perez
(74) *Attorney, Agent, or Firm* — Theodore M. Magee; Westman, Champlin & Koehler, P.A.

(57) ABSTRACT

A detoxification device has an inlet nozzle capable of reducing an amount of a deposit of an adhering metallic product and elongating a maintenance cycle and a detoxification device including the inlet nozzle. The inlet nozzle includes a portion adjacent to a combustor, that is cut (removed) in advance. Consequently, in the portion, an insulator made of a ceramic material is exposed. Since the ceramic material supplies a small number of electrons, even when the insulator is exposed to heat from the combustor to reach a high temperature, a reductive reaction is less likely to occur. Accordingly, even when a metallic exhaust gas is allowed to flow, the metallic exhaust gas is prevented from being precipitated as the metallic product and gradually deposited with time.

4 Claims, 6 Drawing Sheets

(51) Int. Cl.
*C23C 16/44* (2006.01)
*F23D 14/48* (2006.01)
*F23G 7/06* (2006.01)

(52) U.S. Cl.
CPC .............. *F23D 14/48* (2013.01); *F23G 7/06* (2013.01); *B01D 2258/0216* (2013.01); *F23G 2209/142* (2013.01)

(56) References Cited

FOREIGN PATENT DOCUMENTS

| | | | |
|---|---|---|---|
| JP | 2001355825 A | * | 12/2001 |
| JP | 2014134350 A | | 7/2014 |
| JP | 2015053319 A | | 3/2015 |

OTHER PUBLICATIONS

Watanabe et al. JPH08313160A—translated document (Year: 1996).*
Communication dated May 3, 2022 and Supplementary European Search Report dated Apr. 22, 2022 for corresponding European application Serial No. EP19819498, 8 pages.
PCT International Search Report dated Aug. 6, 2019 for corresponding PCT Application No. PCT/JP2019/021926.
PCT International Written Opinion dated Aug. 6, 2019 for corresponding PCT Application No. PCT/JP2019/021926.

* cited by examiner

DETOXIFICATION DEVICE AND INLET NOZZLE

CROSS-REFERENCE OF RELATED APPLICATION

This application is a Section 371 National Stage Application of International Application No. PCT/JP2019/021926, filed Jun. 3, 2019, which is incorporated by reference in its entirety and published as WO 2019/239935 A1 on Dec. 19, 2019 and which claims priority of Japanese Application No. 2018-113898, filed Jun. 14, 2018.

BACKGROUND

The present invention relates to a detoxification device and an inlet nozzle. More particularly, the present invention relates to a detoxification device that reduces deposition of a metallic precipitate and to an inlet nozzle provided in the detoxification device.

In a device for film deposition as one of process steps when a semiconductor, a solar battery, a liquid crystal, or the like is manufactured, a process gas such as a silane ($SiH_4$) gas is used in a vacuum chamber for generating a Si film.

A discharged gas (exhaust gas) after being used is exhausted to an outside of the vacuum chamber serving as a device for a semiconductor manufacturing process by a vacuum pump connected to the vacuum chamber. In most cases, such a discharged gas contains various toxic gases resulting from a film deposition step, such as the silane gas described above, tungsten hexafluoride ($WF_6$), and dichlorosilane ($SiH_2Cl_2$). Accordingly, to an exhaust side of the vacuum pump, a detoxification device is connected to oxidize such a discharged gas and exhaust the discharged gas as a harmless gas.

This detoxification device comes in various types such as a combustion type and a plasma type. In the case of a combustion type detoxification device, for example, an oxidative reaction in which the discharged gas is burned to react with air (oxygen) is caused to change the toxic gas to a harmless gas.

FIG. 6 is a schematic diagram illustrating a configuration of each of an inlet nozzle 1040 and a combustor (combustion furnace) 1404 in an existing detoxification device 1400.

As illustrated in the drawing, an insulator 1700 serving as an insulating material is provided adjacent to the combustor 1404. An inlet nozzle 1040 having a length corresponding to a thickness of the insulator 1700 is provided in the insulator 1700 to extend therethrough. The detoxification device 1400 is configured such that an exhaust gas is transferred to the combustor 1404 through the inlet nozzle 1040.

When an exhaust gas (hereinafter referred to as the metallic exhaust gas) containing a metal (e.g., titanium or tungsten hexafluoride) is transferred to the combustor 1404 through the inlet nozzle 1040, under radiation of heat from the combustor 1404, a reductive reaction occurs at a tip portion (portion adjacent to the combustor 1404) of the inlet nozzle 1040. Consequently, the exhaust gas is precipitated as a metallic product to be gradually deposited as a metallic product X with time.

A phenomenon in which the metallic product is precipitated is caused by a high temperature and a supply of electrons (supply from the inlet nozzle 1040 made of stainless steel).

The metallic product X has an extremely high hardness and, once the metallic product X is deposited, it is difficult to remove the metallic product X by using a scraper 1408 (see FIG. 4A, a device for scraping off a deposit). Specifically, as illustrated in FIG. 6, the metallic product X is so solidly fixed as to stop movement of the scraper 1408. When this state is left untreated, a flow path is gradually clogged.

As a result, a problem of a shorter maintenance (overhaul) cycle for the detoxification device 1400 arises.

The discussion above is merely provided for general background information and is not intended to be used as an aid in determining the scope of the claimed subject matter. The claimed subject matter is not limited to implementations that solve any or all disadvantages noted in the background.

SUMMARY

An object of the present invention is to provide an inlet nozzle capable of reducing an amount of a deposit of an adhering metallic product and elongating a maintenance cycle and a detoxification device including the inlet nozzle.

The invention claimed in claim 1 provides a detoxification device including: a detoxification chamber; an insulator provided adjacent to the detoxification chamber and made of an insulating material; and an inlet nozzle embedded in the insulator to guide an exhaust gas to be detoxified to the detoxification chamber, the inlet nozzle including a metal precipitation inhibiting structure.

The invention in a further embodiment provides the detoxification device above wherein a portion of the inlet nozzle adjacent to the detoxification chamber has a length set shorter by a predetermined length than an original entire length of the inlet nozzle to expose the insulator.

The invention of a further embodiment provides the detoxification device above wherein a portion set to shorten the inlet nozzle corresponds to a portion on which a metallic product is deposited when the exhaust gas which is a metallic exhaust gas is allowed to flow in a state before the inlet nozzle is shortened.

The invention in a further embodiment provides the detoxification device above wherein the inlet nozzle is formed of an insulating material.

The invention in an embodiment provides an inlet nozzle including: a metal precipitation inhibiting structure, the inlet nozzle being provided in a detoxification device including a detoxification chamber and an insulator provided adjacent to the detoxification chamber and made of an insulating material, the inlet nozzle being embedded in the insulator to guide an exhaust gas to be detoxified to the detoxification chamber.

According to the present invention, it is possible to provide the inlet nozzle using the metal precipitation inhibiting structure provided therein to reduce an amount of a deposit of the metallic product adhering to a tip portion of the inlet nozzle and elongate a maintenance cycle as well as a detoxification device including the inlet nozzle.

The Summary is provided to introduce a selection of concepts in a simplified form that are further described in the Detail Description. This summary is not intended to identify key features or essential features of the claimed subject matter, nor is it intended to be used as an aid in determining the scope of the claimed subject matter.

DETAILED DESCRIPTION

(1) Outline of Embodiment

From each of inlet nozzles 40 according to the present embodiment, a portion adjacent to a combustor 404, i.e., a portion to which a metallic product adheres to be deposited thereon is cut (removed) in advance. Consequently, in the portion, an insulator 700 made of a ceramic material is exposed (metal precipitation inhibiting structure). Since the ceramic material supplies a small number of electrons, even when the insulator 700 is exposed to heat from the combustor 404 to reach a high temperature, a reductive reaction is less likely to occur.

Accordingly, even when a metallic exhaust gas is allowed to flow, it is possible to inhibit the metallic exhaust gas from being precipitated as the metallic product and gradually deposited with time.

As a result, it is possible to reduce a deposit adhering to the portion adjacent to the combustor 404 and consequently elongate a maintenance cycle for a detoxification device 400.

(2) Details of Embodiment

Referring to FIGS. 1 to 5, a detailed description will be given below of each of preferred embodiments of the present invention.

Figure 1:
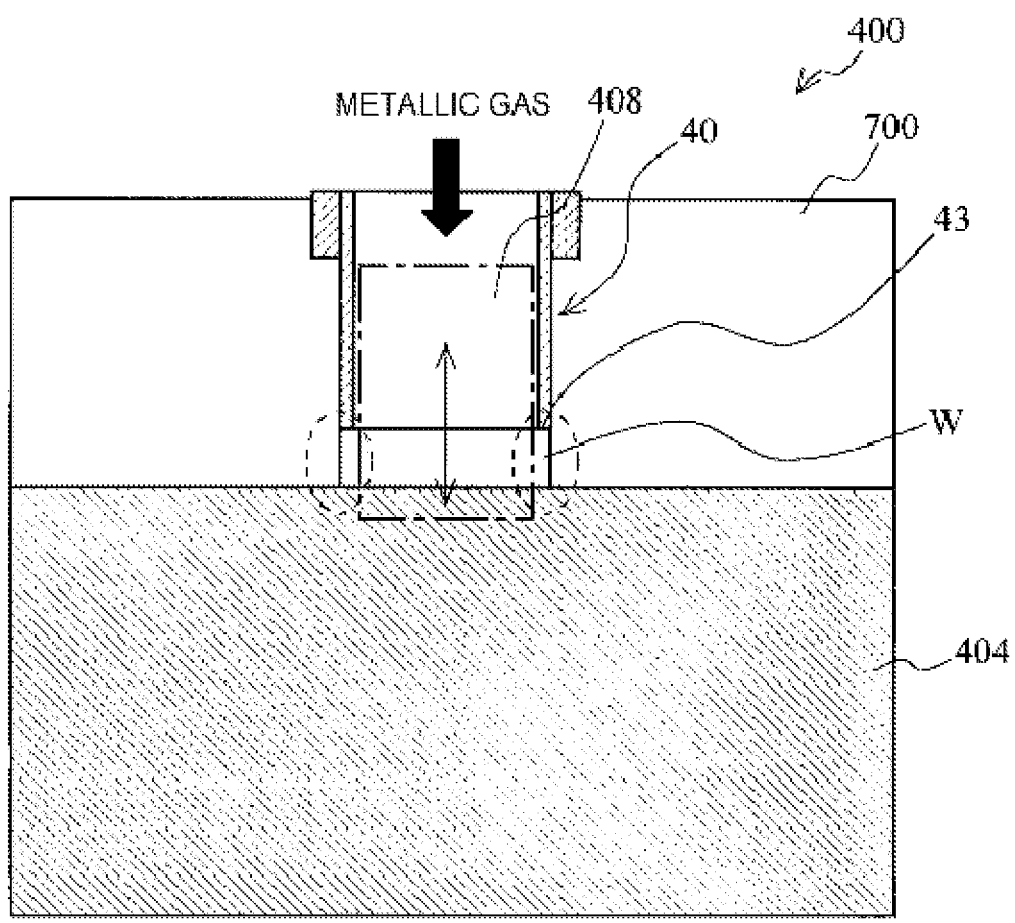
FIG. 1 is a schematic diagram illustrating a configuration of each of inlet nozzles and a combustor in a detoxification device according to the present invention.

FIG. 1 is a schematic diagram illustrating a relationship between each of the inlet nozzles 40 and the combustor 404 in the detoxification device 400 according to the present embodiment.

From each of the inlet nozzles 40 according to the present embodiment, a portion close to the combustor (detoxification chamber) 404 of the inlet nozzle 40 is cut (removed) to shorten the inlet nozzle 40 by a given length. In other words, a portion of the inlet nozzle 40 on which, when the metallic exhaust gas is allowed to flow, the metallic exhaust gas is normally precipitated as the metallic product to be gradually deposited with time is removed in advance.

Consequently, a portion of the insulator 700 adjacent to the combustor 404 is exposed to a path for the exhaust gas (exposed portion W). The insulator 700, which is made of a ceramic material, supplies a smaller number of electrons than that of electrons supplied from the inlet nozzle 40 made of a stainless steel. As a result, even when the metallic exhaust gas is allowed to flow, it is possible to prevent the metallic exhaust gas from being precipitated as the metallic product and solidly adhering to the place.

Due to this configuration, even when the exposed portion W of the insulator 700 is exposed to radiation of heat from the combustor 404, a reductive reaction is less likely to occur in the exposed portion W of the insulator 700 to prevent the metallic exhaust gas from being precipitated as the metallic product and being gradually deposited with time.

As a result, it is possible to reduce the deposit adhering to the portion adjacent to the combustor 404 and consequently elongate a maintenance cycle for the detoxification device 400.

Figure 2:
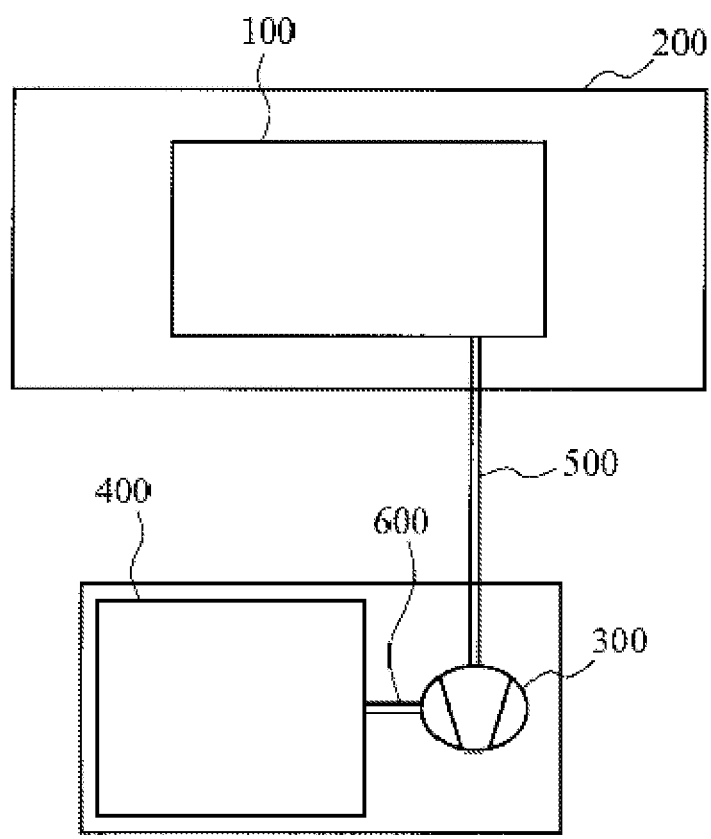
FIG. 2 is a diagram illustrating an example of a schematic configuration for illustrating a system layout in which the detoxification device including the inlet nozzles according to the present invention is disposed.

FIG. 2 is a diagram illustrating an example of a schematic configuration for illustrating a system layout in which the detoxification device 400 including the inlet nozzles 40 according to the embodiment of the present invention is disposed.

In the embodiment, it is assumed by way of example that the detoxification device 400 in which the inlet nozzles 40 are disposed is a combustion type detoxification device. However, the detoxification device 400 in which the inlet nozzles 40 according to the embodiment of the present invention are disposed is not limited to the combustion type. Instead, the inlet nozzles 40 according to the present embodiment can also be disposed in, e.g., the detoxification device 400 of a heater type or a gasoline-engine type or the like.

A processing device (processing chamber) 100 disposed in a clean room 200, such as a wafer deposition device, is connected to a dry pump 300 via a vacuum pipe 500. The dry pump 300 is further connected to the detoxification device 400 via an exhaust pipe 600.

A casing forming a housing of the detoxification device 400 has a substantially cylindrical shape and has an upper end configured to have an inlet head 403 (FIG. 3) serving as a lid portion. The casing need not necessarily have the substantially cylindrical shape as long as the casing is configured to have an inner space isolated from an outside thereof.

Figure 3:
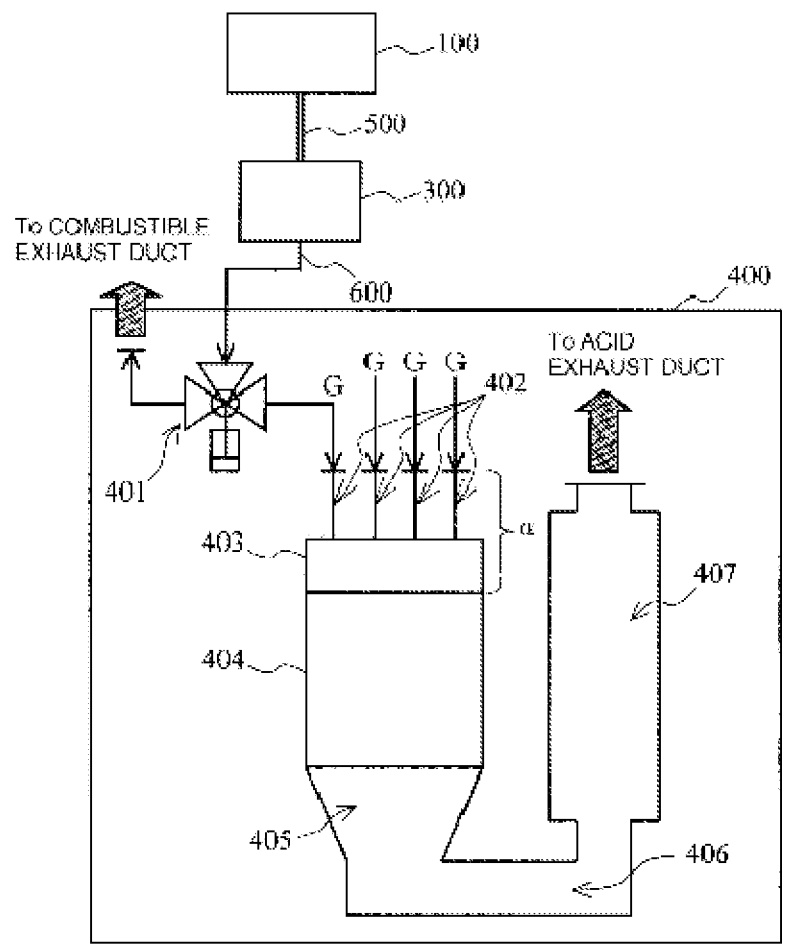
FIG. 3 is a diagram illustrating an example of a schematic configuration of the detoxification device including the inlet nozzles according to the present invention.

FIG. 3 is a diagram illustrating an example of a schematic configuration of the detoxification device 400 in which the inlet nozzles 40 according to the embodiment of the present invention are disposed. Arrows G in the drawing represent flows of the exhaust gas containing a gas to be detoxified.

The exhaust gas containing a toxic gas exhausted from the processing device 100 passes through the vacuum pipe 500, goes through the dry pump 300, and passes through the exhaust pipe 600 to be delivered to the detoxification device 400.

Then, an inlet three-way valve 401 divides the exhaust gas into an exhaust gas to be exhausted into a combustible exhaust duct and an exhaust gas to be transferred to the combustor (combustion furnace) 404.

The exhaust gas passes through an inlet pipe 402 and then goes through the inlet head (gas inlet port) 403 to be delivered to the combustor 404.

The combustor 404 is a space in which the gas to be detoxified containing the toxic gas is to be subjected to combustion processing, and a temperature in the combustor 404 is approximately around 800° C. In the inlet head 403, the insulator 700 is disposed for heat insulation and, in the insulator 700, the inlet nozzles 40 are embedded.

The detoxification device 400 according to the present embodiment includes the combustor 404 serving as the combustion furnace and a quench 405 serving as an exhaust gas cooler.

Into the combustor 404, a gas to be processed such as a combustible gas or a cleaning gas exhausted from a Chemical Vapor Deposition (CVD) device for a semiconductor manufacturing process, which is not shown, via the vacuum pump 300 such as the dry pump is introduced, via the inlet pipe 402, from the inlet head 403 disposed at an upstream end of the combustor 404 and serving as the inlet port of the detoxification device 400. The combustor 404 combusts and decomposes the introduced gas to be processed at a high temperature.

Examples of the combustible gas include a colorless toxic silane ($SiH_4$) gas, a colorless (yellow) toxic high-pressure tungsten hexafluoride ($WF_6$) gas, and dichlorosilane ($SiH_2Cl_2$). Examples of the cleaning gas include ammonium ($NH_3$).

In the present embodiment, the exhaust gas exhausted from the vacuum pump and introduced into the combustor 404 from the inlet head 403 is combusted and decomposed by the combustor 404. By the combustion/decomposition, the toxic gas contained in the exhaust gas is detoxified.

An exhaust gas resulting from the combustion/decomposition is cooled from about 800° C. to about 80° C. by the quench 405 serving as the gas cooler. Note that, for the cooling of the exhaust gas, cooling water is used.

Then, the cooled exhaust gas and fine particle dust resulting from the combustion/decomposition are exhausted from an exhaust port (downstream end) of the combustor 404 to be introduced into a packed tower 407 serving as a wet detoxifier through a cyclone 406 serving as a powder remover. A water-soluble gas such as hydrogen fluoride (HF) or hydrogen chloride (HCl) is dissolved in this portion. Then, the exhaust gas is transferred to an acid exhaust duct to be exhausted.

Note that, in the present embodiment, each of the cyclone 406 and the packed tower 407 is formed of polypropylene.

Figure 4A:
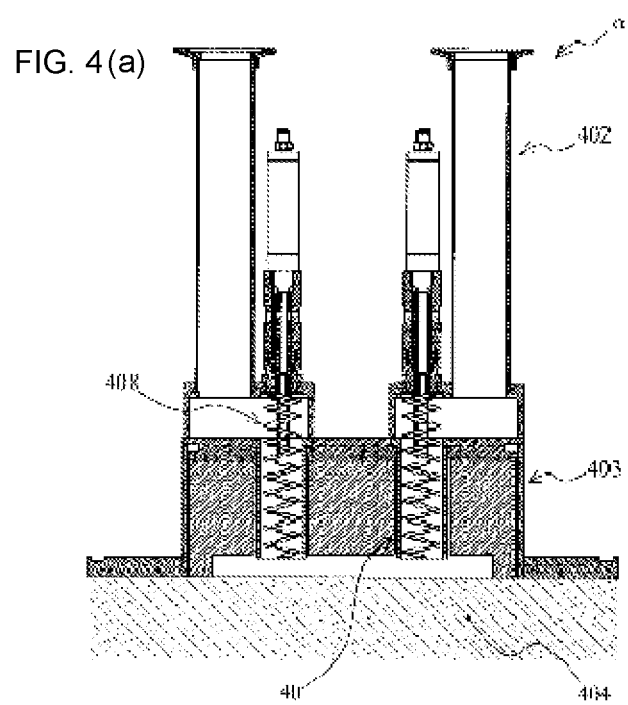
FIGS. 4A and 4B are diagrams for illustrating a periphery of an inlet head in the detoxification device including the inlet nozzles according to the present invention.
Figure 4B:
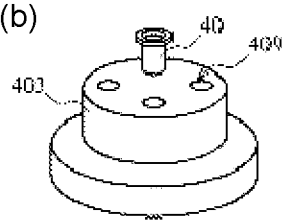

FIGS. 4A and 4B are diagrams for illustrating a periphery of the inlet head 403 in the detoxification device 400 including the inlet nozzles 40 according to the embodiment of the present invention.

FIG. 4A illustrates an overall view of a portion a (the inlet pipe 402, the inlet head 403, the combustor 404, and a scraper 408 described later) in FIG. 3, which is a cross-sectional view along an axial direction. FIG. 4B illustrates a view obtained by viewing the portion a (the inlet nozzles 40 and the inlet head 403) in FIG. 3 from an upstream side in the flows of the exhaust gas.

In the present embodiment, by way of example, the inlet head 403 is configured to be include four inlet holes 409 in which the inlet nozzles 40 are disposed. However, the number of the inlet holes 409 can appropriately be changed to 6, 8, or the like as required.

Note that, by way of example, a material of the inlet head 403 according to the embodiment of the present invention is preferably stainless steel in terms of heat resistance and workability.

In each of the inlet nozzles 40, the scraper 408 for removing a deposit adhering to a downstream end (closer to the combustor 404) of the inlet nozzle 40 is deposited.

When the exhaust gas is allowed to flow, the deposit of the precipitated product is scraped off by the scraper 408 to be removed. However, the product derived from the metallic exhaust gas has an extremely high hardness and, once deposited, the product is extremely hard to remove.

Note that, in the present embodiment, the scraper 408 is configured in the form of an elastic body (spring), but the configuration of the scraper 408 is not limited thereto. For example, the scraper 408 may also be configured in the form of a rod, a blade, or a paddle.

Figure 5A:
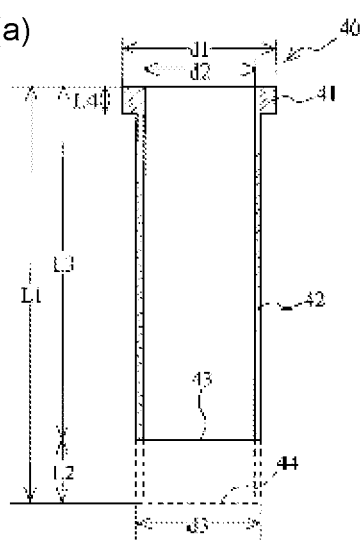
FIGS. 5A and 5B are diagrams for illustrating each of the inlet nozzles according to the present invention.
Figure 5B:
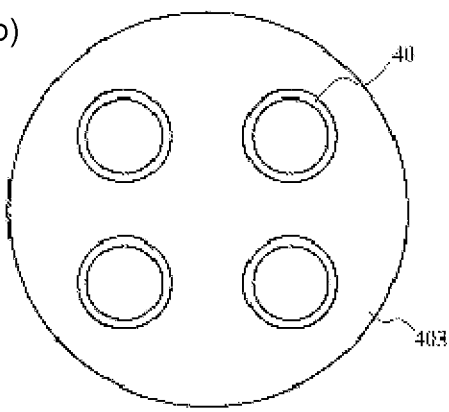
Figure 6:
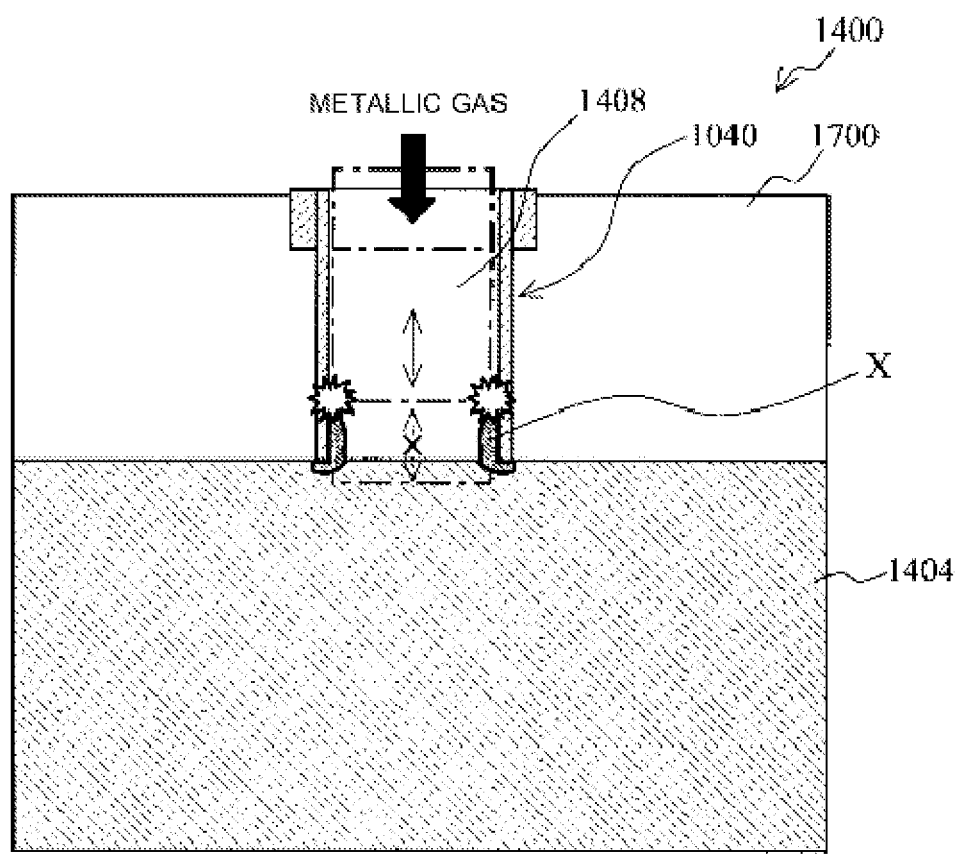
FIG. 6 is a schematic diagram illustrating a configuration of each of an inlet nozzle and a combustor in an existing detoxification device.

FIGS. 5A and 5B are diagrams for illustrating each of the inlet nozzles 40 according to the embodiment of the present invention.

FIG. 5A is a diagram illustrating a cross section of each of the inlet nozzles 40 along the axial direction. FIG. 5B is a diagram obtained by viewing the inlet head 403 in which the inlet nozzles 40 are disposed from below (from a downstream side when the exhaust gas flows). The inlet nozzle 40 has a lower end thereof adjacent to the combustor 404.

As described above, the material of the inlet nozzles 40 according to the present embodiment is stainless steel. Instead, the material of the inlet nozzles 40 according to the present embodiment may also be Inconel (registered trademark), which is a nickel-base superalloy, or hastelloy (metal precipitation inhibiting structure).

Bach of the inlet nozzles 40 according to the present embodiment is a component that provides communication between the inlet pipe 402 and the inlet head 403 in the detoxification device 400, which is substantially a casing having an inner void and includes a flange portion 41, a casing side portion 42, a cut surface 43, a (former bottom portion 44), and the like.

The flange portion 41 is located in an upper half of the inlet nozzle 40 in the axial direction (i.e., on the upstream side of a flowing gas) to be fitted into the inlet pipe 402.

The casing side portion 42 forms a side surface of the inlet nozzle 40, which is a cylindrical casing in the present embodiment and fitted into any of the inlet holes 409 provided in the inlet head 403.

By way of example, each of the inlet nozzles 40 according to the present embodiment is configured such that a length (before cutting) L1 of the entire inlet nozzle 40 in the axial direction is about 76.6 millimeters, a length L2 of a cut portion is 10.0 millimeters, and a length L4 of the flange portion 41 in the axial direction is 6 millimeters. Accordingly, a length L3 of the inlet nozzle 40 in the axial direction after cutting is 66.6 millimeters. The length (before cutting) L1 of the entire inlet nozzle 40 in the axial direction corresponds to a thickness of the insulator 700 in the axial direction in FIG. 1. Consequently, the exposed portion W of the insulator in FIG. 1 has an axial length of 10.0 millimeters.

The length of the cut portion in the present embodiment corresponds to a portion on which, when the metallic exhaust gas is allowed to flow, the metallic exhaust gas is precipitated as the metallic product to be deposited. In other words, the portion of the inlet nozzle 40 close to the combustor 404 which receives a large amount of heat from the combustor 404 is cut in advance. The length of the cut portion is set appropriately depending on such conditions as a type of the metallic exhaust gas allowed to flow and a temperature of the combustor 404.

However, cutting off fifty percent or more of the inlet nozzle 40 is not desirable because a function of the inlet nozzle 40 serving as a guide for the exhaust gas may be disturbed. In the present embodiment, the length of the cut portion preferably accounts for about 4% to 20%, or more preferably about 10%±3-4% of the total pre-cutting length of the inlet nozzle 40.

Note that, even when the inlet nozzle 40 is cut, a portion thereof close to the cut surface 43 still receives an amount of heat from the combustor 404. However, since the portion close to the cut surface 43 is farther away from the combustor 404 than the former bottom portion 44 which used to be a bottom surface of the inlet nozzle 40, the amount of the received heat decreases to be able to inhibit the generation of the metallic product.

By way of example, each of the inlet nozzles 40 according to the embodiment of the present invention is configured such that an outer diameter d1 of the flange portion 41 of the inlet nozzle 40 is 33 millimeters, an inner diameter (inner diameter of an upper portion of the casing of the inlet nozzle 40) d2 of the flange portion 41 is 24 millimeters, and an outer diameter d3 of the casing side portion 42 is 26.7 millimeters.

Due to the configuration described above, in the detoxification device 400 in which the inlet nozzles 40 according to the present embodiment are disposed, the exhaust gas (metallic exhaust gas) introduced from the inlet pipe 402 passes through the inlet nozzles 40 to be transferred to the combustor 404. In addition, since a lower end portion of each of the inlet nozzles 40 is shortened, the exhaust gas (metallic exhaust gas) is allowed to flow, while being kept in contact with the exposed portion W of the insulator 700, to flow into the combustor 404.

Note that an inner surface (portion in contact with the metallic exhaust gas) of the inlet nozzle 40 is preferably made of a material as smooth as possible or in a condition as smooth as possible. When the surface of the inlet nozzle 40 is smooth, the metallic product is less likely to adhere thereto or, even when the metallic product adheres to the surface of the inlet nozzle 40, the metallic product easily peels away.

(3) Second Embodiment

In a second embodiment, the inlet nozzles 40 made of an insulating material (metal precipitation inhibiting structure) are used. By producing the inlet nozzles 40 of the insulating material, electrons supplied therefrom are reduced, and the reductive reaction is less likely to occur in the metallic exhaust gas. As a result, it is possible to inhibit the metallic product from being deposited.

However, the tip portion of each of the inlet nozzles 40, which is adjacent to the combustor 404, is heated to a considerably high temperature, and therefore a material having a high heat resistance is desirable.

Accordingly, a material to be used preferably has an insulating property, a heat resistance, and a spreadability in consideration of workability.

Specific examples of the material include free-machining ceramics (machinable ceramics).

As required, the embodiments of the present invention may also be configured to be combined with each other.

In addition, various modifications can be made in the present invention without departing from the spirit of the present invention. It is intended that the present invention covers such modifications Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

What is claimed is:

1. A detoxification device comprising:
   a detoxification chamber;
   an insulator provided adjacent to the detoxification chamber and made of an insulating material; and
   an inlet nozzle embedded in the insulator to guide an exhaust gas to be detoxified to the detoxification chamber, wherein
   the inlet nozzle is located along an axial direction of the detoxification chamber, has a single casing, the single casing being in contact with the insulator and defining an unobstructed interior void, and has an axial length,
   a portion of the insulator adjacent to the detoxification chamber is exposed uniformly all around in the axial direction to a path for the exhaust gas, wherein the portion has an axial length extending from the detoxification chamber to an end of the inlet nozzle where the inlet nozzle is in contact with the insulator, and
   the axial length of the portion of the insulator is less than fifty percent of the sum of the axial length of the portion of the insulator and the inlet nozzle.

2. The detoxification device according to claim 1, wherein a portion set to shorten the inlet nozzle uniformly all around in the axial direction corresponds to a portion on which a metallic product is deposited when the exhaust gas which is a metallic exhaust gas is allowed to flow in a state before the inlet nozzle is shortened.

3. The detoxification device according to claim 1, wherein the inlet nozzle is formed of an insulating material.

4. An inlet nozzle provided in a detoxification device including a detoxification chamber and an insulator provided adjacent to the detoxification chamber and formed of an insulating material, and embedded in the insulator to guide an exhaust gas to be detoxified to the detoxification chamber, wherein
   the inlet nozzle is located along an axial direction of the detoxification chamber and has a single casing, wherein the single casing is in contact with the insulator and defines an unobstructed interior void,
   the inlet nozzle is configured to expose a portion of the insulator adjacent to the detoxification chamber uniformly all around in the axial direction to a path for the exhaust gas,
   the inlet nozzle has an axial length and the exposed portion of the insulator has an axial length such that the axial length of the exposed portion of the insulator is less than fifty percent of the sum of the axial length of the inlet nozzle and the axial length of the exposed portion of the insulator.

* * * * *